United States Patent [19]
Ishii et al.

[11] Patent Number: 5,820,683
[45] Date of Patent: Oct. 13, 1998

[54] OBJECT-SUPPORTING BOAT

[75] Inventors: Katsutoshi Ishii, Sagamihara; Isao Hagino, Tokyo; Mitsuo Mizukami, Sagamihara, all of Japan

[73] Assignee: Tokyo Electron Limited, Tokyo, Japan

[21] Appl. No.: 651,887

[22] Filed: May 22, 1996

[30] Foreign Application Priority Data

May 26, 1995 [JP] Japan .................................. 7-152677

[51] Int. Cl.⁶ .................................................. C23C 16/00
[52] U.S. Cl. .......................................................... 118/728
[58] Field of Search ............................................. 118/728

[56] References Cited

U.S. PATENT DOCUMENTS 5,054,418 10/1991 Thompson et al. .

FOREIGN PATENT DOCUMENTS

| 1-239853 | 9/1989 | Japan . |
| 4-305920 | 10/1992 | Japan . |
| 5-129214 | 5/1993 | Japan . |
| 6-9139 | 2/1994 | Japan . |
| 6-22208 | 3/1994 | Japan . |
| 6-22262 | 3/1994 | Japan . |
| 6-338459 | 12/1994 | Japan . |

*Primary Examiner*—Richard Bueker
*Attorney, Agent, or Firm*—Oblon, Spivak, McClelland, Maier & Neustadt, P.C.

[57] ABSTRACT

A boat includes a boat body, a top plate mounted on one end and a bottom plate mounted on the other end of the boat body. The boat body has a prop section and the prop section has a plurality of support portions provided parallel to each other along its longitudinal direction and each having a substantially circular arc-like configuration. The support portion has an opening at a front side to allow the forward end of an arm to be entered into an inside of the support portion to transfer a wafer W. Another opening is provided in a back section of a prop section at an area corresponding to the opening to allow the forward end of the arm to extend through it. The support portion supports the wafer W with the wafer edge portion set on its rest surface. The support portion and its rest surface are so formed as to have a substantially circular arc-configuration. By doing so, the rest surface of the support portion supports the wafer edge portion over as greater a length as possible. The rest surface of the support portion has its flatness set to be not more than 0.1 mm. When the wafer W is placed on the rest surface, the rear surface of the wafer edge portion is set substantially in face contact with the rest surface of the support portion.

10 Claims, 5 Drawing Sheets

OBJECT-SUPPORTING BOAT

BACKGROUND OF THE INVENTION

1. Field of the Invention

The present invention relates to a boat supporting objects to be processed, such as semiconductor wafers and, in particular, to an object-supporting boat adapted to be loaded with to-be-processed wafers supported thereon into a vertical type heat processing apparatus.

2. Description of the Related Art

In the manufacturing process of a semiconductor device, such as the formation of an oxide film, diffusion of impurities and film formation, various kinds of heat processing are performed on semiconductor wafers. For heat processing, a vertical type heat processing apparatus has been mainly used.

Usually, with the vertical type heat processing apparatus, the so-called batch processing is performed, that is, processing is made on a greater number of semiconductor wafers at a time. In the batch type vertical heat processing apparatus, a boat has been employed for a plurality of semiconductor wafers to be loaded, heat-processed and unloaded.

Figure 1:
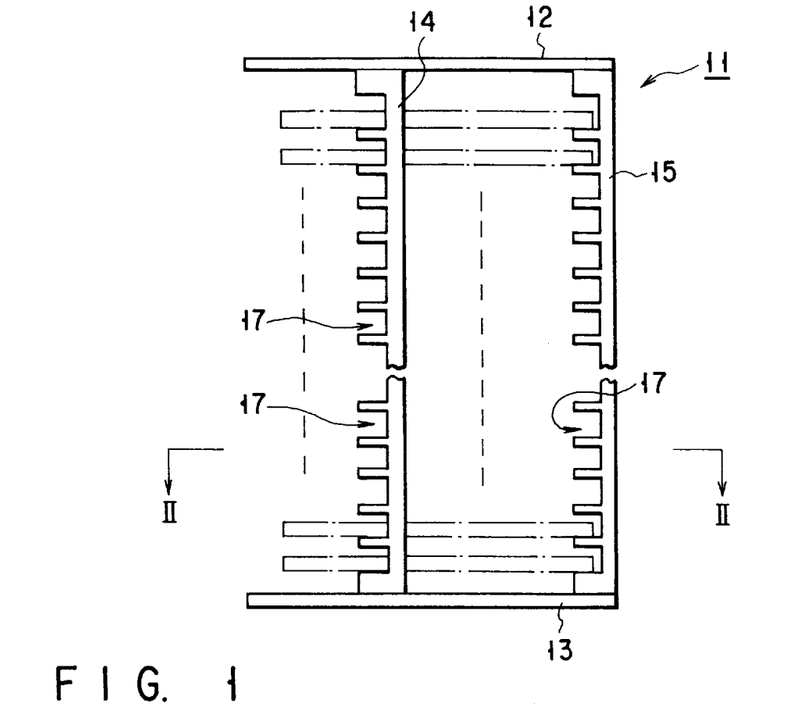
FIG. 1 is a side view showing an example of a conventional boat.
Figure 2:
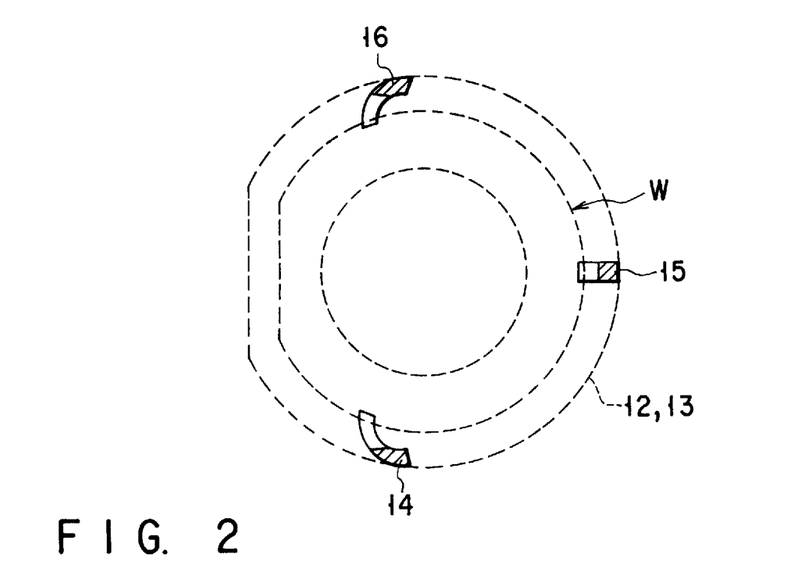
FIG. 2 is a cross-sectional view as taken along line II—II in FIG. 1.

FIG. 1 is a side view showing one example of a conventional boat and FIG. 2 is a cross-sectional view as taken along line II—II in FIG. 1.

The boat 11 includes upper and lower flat plates 12 and 13 arranged in parallel to, and opposite to, each other and three prop sections 14, 15 and 16 provided between the upper flat plate 12 and the lower flat plate 13. The prop sections 14, 15 and 16 are equidistantly arranged on the same circumference.

Grooves 17 are provided at predetermined intervals in the respective prop sections 14 to 16 along a longitudinal direction of the boat 11. The grooves 17 are so formed as to support a peripheral edge portion of one wafer W in corresponding three grooves 17 at the same height of the props 14 to 16. Thus, the wafer W is supported at three points.

Depending upon the size of the vertical type heat processing apparatus, 150 grooves for instance are provided as the grooves 17 at each of the prop sections 14 to 16. In consequence, one boat 11 supports 150 wafers W, including product and dummy wafers, and 150 wafers W can be processed by one heat processing.

Recently, the wafers W become larger in diameter. The greater the wafer W, the heavier the wafer becomes. In the conventional boat 10 as shown in FIG. 1, the wafer W is supported at three points in which case loads are concentrated on three points where the wafer W is supported. If, in this state, the wafer W is heat processed, there are sometimes the cases where, when the durability of the wafer W is degenerated due to high temperature involved, the so-called "slip", that is, a crystal defect in the wafer resulting from heat stress, occurs. As a result, the throughput of wafers W is markedly lowered due to heat processing.

With the diameter of the wafer W increased and the mass of the wafer W increased, such "slip" occurs more frequently. In the conventional boat 10 as shown in FIG. 1, no particular inconvenience is encountered in the case where a 6-inch wafer is heat processed, but if eight-inch or more sized wafers are processed, such slip occurs more frequently.

The slip is caused to occur due to an increase in mass of the wafer W above and in the diameter of the wafer W in which case, at a time of heat processing, in particular, at a time of elevating the temperature, a temperature difference is made greater between a central portion and a peripheral edge portion of the wafer W and a heat stress is increased due to such a temperature difference.

SUMMARY OF THE INVENTION

This is accordingly the object of the present invention to provide a boat supporting objects, to be processed, which can prevent occurrence of defects in the object.

According to the present invention, there is provided a boat for supporting a plurality of objects to be processed, comprising a bottom section, a prop section mounted upright on the bottom section, a top plate mounted on an upper end of the prop section, and a plurality of support portions supported on the prop section and each having a rest surface where a object to be processed is placed, wherein the rest surface of the support portion is so set that a flatness thereof is not more than 0.1 mm.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The embodiments of the present invention will be explained below with reference to the accompanying drawings.

Figure 3:
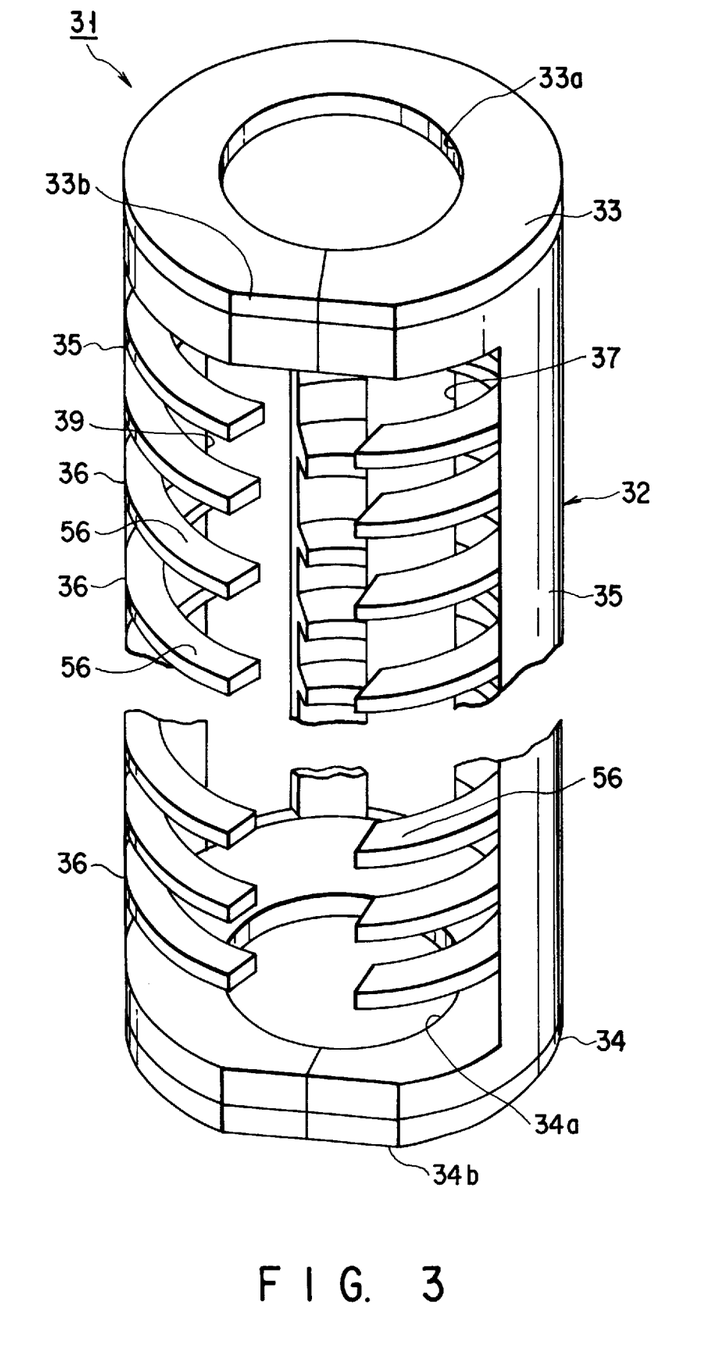
FIG. 3 is a perspective view showing a boat according to one embodiment of the present invention.
Figure 4:
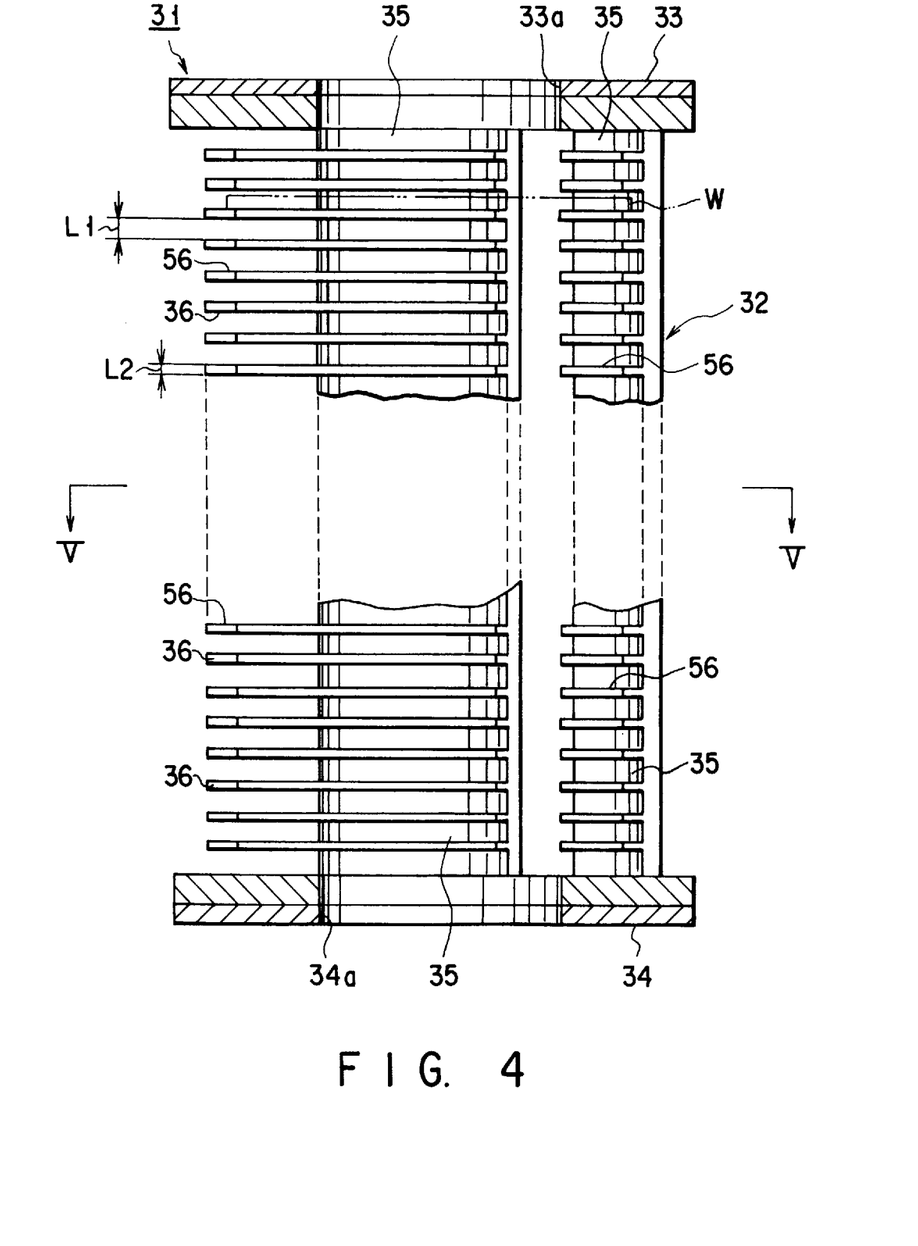
FIG. 4 is a vertical cross-sectional view showing the boat shown in FIG. 3.
Figure 5:
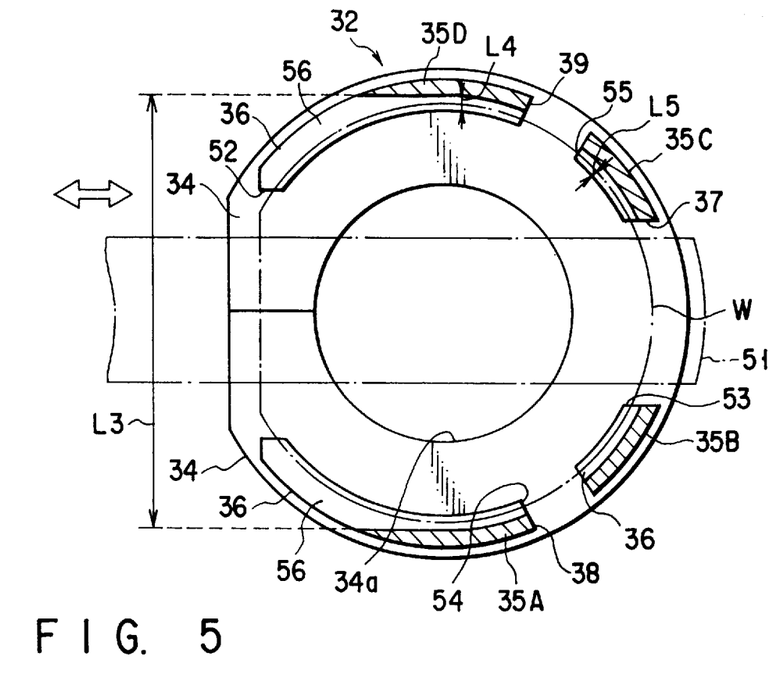
FIG. 5 is a horizontal cross-sectional view as taken along line V—V in FIG. 4.

FIG. 3 is a perspective view showing a boat according to the present embodiment. FIG. 4 is a vertical cross-sectional view showing the boat as shown in FIG. 3 and FIG. 5 is a horizontal cross-sectional view taken along line V—V in FIG. 4.

A boat 31 includes a boat body 32 and a top plate and bottom plates 33 and 34 mounted one on each end of the boat body 32. The boat body 32 includes a prop section 35 and a plurality of support portions 36 provided on the prop section 35 to support wafers W. The boat body 32, top plate 33 and bottom plate 34 are made of quartz or silicon carbide (SiC). The silicon carbide is preferable over the quartz in terms of heat resistance.

The prop section 35 of the boat body 32 is mounted substantially upright relative to the bottom plate 34 as shown in FIG. 4. The prop section 35 is substantially semi-cylindrical as shown in FIG. 5. The prop section 35 has a through hole 37 formed along its longitudinal direction to allow an arm 51 which conveys the wafer W toward a back side to extend therethrough. The prop section 35 has slits 38, 39 along its longitudinal direction so as to alleviate a stress when the boat body 32 is so cut as will be set out below. In this embodiment the slits 38 and 39 are about 30 mm in width and, in a position corresponding to the line V—V in FIG. 4, the cross-section of the prop section 35 is shown as four divided portions 35A, 35B, 35C and 35D in FIG. 5.

Support portions 36 are arranged parallel to each other along the longitudinal direction of the prop section 35. The support portion 36 is substantially circular arc-like in configuration as shown in FIG. 5. The support portion 36 has a load/unload opening 52 at a front-side to allow the forward end portion of the arm 51 to be entered into the inside of the support portion 36. The width of the load/unload opening 52 is about 120 mm in the embodiment.

The back portion and the side portion of the support portion 36 is provided along an inner wall surface of the prop section 35 semi-cylindrical in configuration.

At the back portion of the support portion 36 an opening 53 is provided relative to the through hole 37 in the prop section 35 to allow the forward end portion of the arm 51 to extend therethrough. In this embodiment, the opening 53 is about 90 mm in width. Openings 54, 55 are provided relative to the side portion of the support portion 36 to correspond to slits 38 and 39 in the prop section 35.

As set out above, the support portion 36 of the present embodiment corresponds to a ring member excluding the load/unload opening 52, openings 53, 54, 55.

The above-mentioned support 36 supports the wafer W such that its wafer peripheral edge portion is set on a rest surface 56. It is preferred that a ratio of a total circumferential length of parts of the wafer W set in contact with the rest surface 56 to the full circumferential length of the wafer W be made greater.

In this embodiment, as set out above, the support portion 36 is formed to have a substantially circular-arc configuration and the rest surface 56 is also formed to have a substantially circular-arc configuration. Stated in more detail, the support portion 36 corresponds to a ring-like member excluding, as already explained above, the load/unload opening 52, openings 53, 54, 55. Thus the rest surface 56 has also a ring-like configuration with no extra openings except in the case necessary to insert/withdraw the arm 51 for instance. By doing so, the rest surface 56 supports the wafer edge portions over as long a distance as possible.

Further, the rest surface 56 of the support portion 36 has its flatness set to be at not more than 0.1 mm over the whole surface. Here, the flatness means a difference between a height of a given point, on one hand, on the rest surface 56 of the support portion 36 from a plane (hereinafter referred to as a reference plane) on which the boat 31 is placed with the bottom plate 34 down and a height of another given point, on the other hand, on the rest surface 56 of the support portion 36. In consequence, the flatness of the rest surface 56 is very high in accuracy. When the wafer W is placed on the rest surface 56, a rear surface of the edge of the wafer W is contacted with the rest surface 56. The rear surface of the wafer W is a substantially flat and the rest surface 56 is also substantially flat, as described above. Therefore, the two substantially planes are contacted each other. In other words, the wafer W and the rest surface 56 are substantially face contact each other.

As shown in FIG. 4, a clearance L1 is created between one support portion 36 and the adjacent support portion 36 and, in this embodiment, the clearance L1 is set to be, for example, 3 to 7 mm. Further, the thickness L2 of the support portion 36 is set to be, for example, 2 to 4 mm. As the support portion 36, 150 support portions for instance is provided in one boat 31.

Further, the rest surface 56 is so dimensioned that a distance L3 between the prop portions 35A and 35D (cross-section) at the opposite sides of the boat body 32 is so set as to be made greater than the diameter of the wafer W on the rest surface 56. By doing so, it is possible to transfer the wafer W by the arm 51 without any interference between the wafer W on one hand and prop portions 35A, 35D (cross-section) on the other hand.

Further, the width L4 of the rest surface 56 defined along the prop portions 35A, 35B, 35C and 35D (cross-section) is so set as to be made greater than a length L from the edge of the wafer W properly set on the rest surface 56 as measured relative to the their contact area. In this embodiment, L5=5 mm while, on the other hand, L4=8 mm. In consequence, these dimensions provide an allowance of about 3 mm when the wafer W is placed on the rest surface 56.

The diameter of a circle defined by the outer edge of the rest surface 56 along the prop portions 35A, 35B, 35C and 35D is made greater than that of the wafer W. In this embodiment, the diameter of the circle above is set to be about 205 mm for an eight-inch wafer (200 mm in diameter).

In this embodiment, the prop section 35 and support portions 36 of the boat body 32 provide an integral structure. The boat body 32 is made of, for example, quartz or silicon carbide and can be formed by cutting a cylindrical member. Stated in more detail, a cylindrical member of silicon carbide is prepared. The cylindrical member is cut by a cutter, such as a water jet, to provide a longitudinal hole at a front side corresponding to a load/unload opening 53. Then a longitudinal hole is formed by a similar cutting method in a back section of the cylindrical member at an area corresponding to a through hole 37 in the prop section 35 and opening 53 in support portions 36. Further, slits 38 and 39 are formed in the cylindrical member at a side area. Then a diamond cutter, being rotated, is fed in the cylindrical member from a front side toward a back side and, through a repetitive process, the cylindrical member is cut by the diamond cutter at a plurality of steps to provide a plurality of support portions 36.

At the end of a cutting operation, a 50 to 100 $\mu$m-thick close silicon carbide film is deposited by a CVD method over the whole boat body 32 so as to bury a porous surface created by the cutting process on the boat body 32. The thickness of the silicon carbide is 100 $\mu$m at max. and very thin, thus does not affecting the flatness of each rest surface 56. In this way it is possible to obtain a final boat body 32 as set out above.

At the above-mentioned formation, the slits 38, 39 in the side portion of the cylindrical member serve as a stress reliever during the cutting of the cylindrical member by the diamond cutter. The slits 38 an 39 are preferable in view of their stress relieving action so that the horizontal cross-section widths of those prop portions 35A and 35B and 35C and 35D of a prop section 35 left after the cutting operation may be made substantially the same. The slits 38 and 39 also help to accelerate a flow of a process gas into the boat during heat processing and, by doing so, uniform heat processing can be done on the wafer W.

A top plate 33 and bottom plate 34 are mounted on corresponding ends of the boat body 32. Openings 33*a* and 34*a* are provided respectively in the top plate 33 and bottom plate 34. By doing so, the heat capacity of the top plate 33 and bottom plate 34 is decreased, suppressing any extra heat from being accumulated in the top plate 33 and bottom plate 34. As a result, those wafers W situated at the upper and lower side of the boat 31 are prevented form being excessively heated in comparison with the rest of the wafers W. Cutouts 33*b* and 34*b* are provided at the front side of the top plate 33 and bottom plate 34, that is, at the load/unload side of the support portions 36. By doing so, when the boat 31 is placed on a flat plane with its longitudinal area substantially perpendicular to that flat plane, it is possible to prevent the boat 31 from being turned over.

Figure 6:
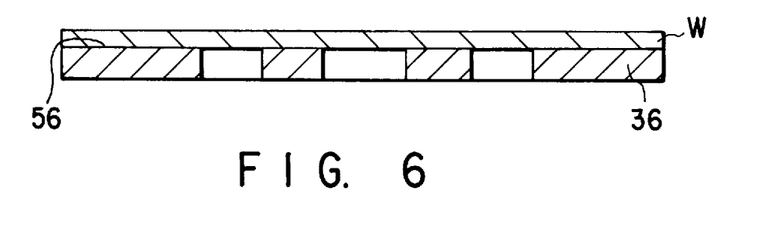
FIG. 6 is a diagrammatic view showing a state in which a wafer is set in contact with a rest surface of a support portion.

In the boat 31 with a plurality of wafers W placed thereon as explained above, the support portions 36 each having the rest surface are so formed as to have a substantially circular arc-like configuration. Since the flatness of the rest surface 56 of every support portion 36 is set to be not more than 0.1 mm, the peripheral edge portion of the wafer W is brought in positive face contact with the wafer W, as shown in FIG. 6, on a microscopic basis, so that the wafer W, being placed on the rest surface 56, is supported on a flat surface at its peripheral edge portion. This properly distributes a wafer load on the rest surface 56 and prevents it from being concentrated toward a point. As a result, when the wafer is heat processed, thermal stress exerted on the wafer W is relieved, thus suppressing the generation of a slip.

Figure 7:
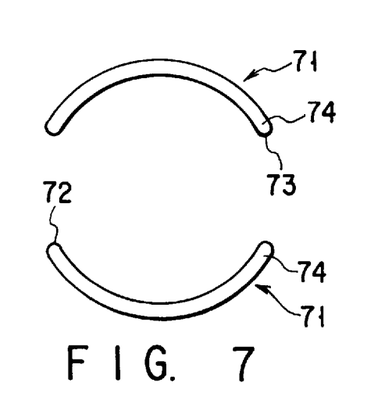
FIG. 7 is a diagrammatic view showing a variant of the support portion of the boat according to the present invention.
Figure 8:
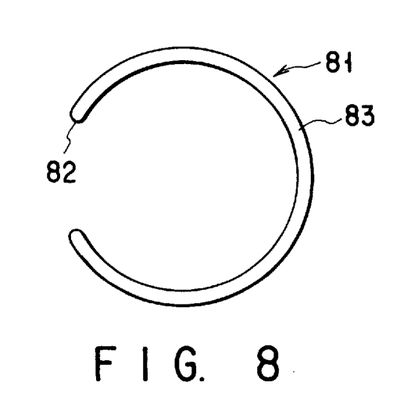
FIG. 8 is a diagrammatic view showing another variant of the support portion of the boat according to the present invention.

FIGS. 7 and 8, each, show a diagrammatic view showing a variant of a support section of a boat. Although, in the above embodiment, a pair of slits 38, 39 have been explained as being provided n the prop section so as to alleviate stress during the cutting operation of the boat body 32, it is desirable that no such slits 38, 39 be provided so as to give a greater contact area to the wafer W and rest surface.

The support portion 71 in FIG. 7 has no such slits for stress relief and has a load/unload inlet 72 for allowing the forward end of an arm which transfers a wafer W via the front side to be inserted into a corresponding support portion 71 and an opening 73 for allowing the forward end of the arm to extend therethrough. A flatness of a rest surface 74 of the support portion 71 is set to be below 0.1 mm. In this example, the support portion 36 is more difficult to cut than the support portion 36 as shown in FIG. 5 and is made greater in area and length so that it can enhance an effect with which a slip is suppressed from being generated.

In the support portion 81 as shown in FIG. 8, stress relief slits, as well as an opening provided in a back section of a boat body to allow a forward end of an arm to extend therethrough, can be omitted and, instead, a load/unload inlet 82 only is provided at a front side to allow a forward end of an arm which transfers the wafer W to be inserted into an inside of the support portion 81. The flatness of the rest surface 83 of the support portion 81 is set to be below 0.1 mm. In this example, the rest surface 83 is made greater in area and in length than in the support portion 36 as shown in FIGS. 5 and 7 and it is possible to still further enhance an effect with which a slip is suppressed from being generated. If a wafer W is transferred to a corresponding support portion 81 of a boat, a wafer carrying arm is prevented from extending through a back section of the boat.

Figure 9:
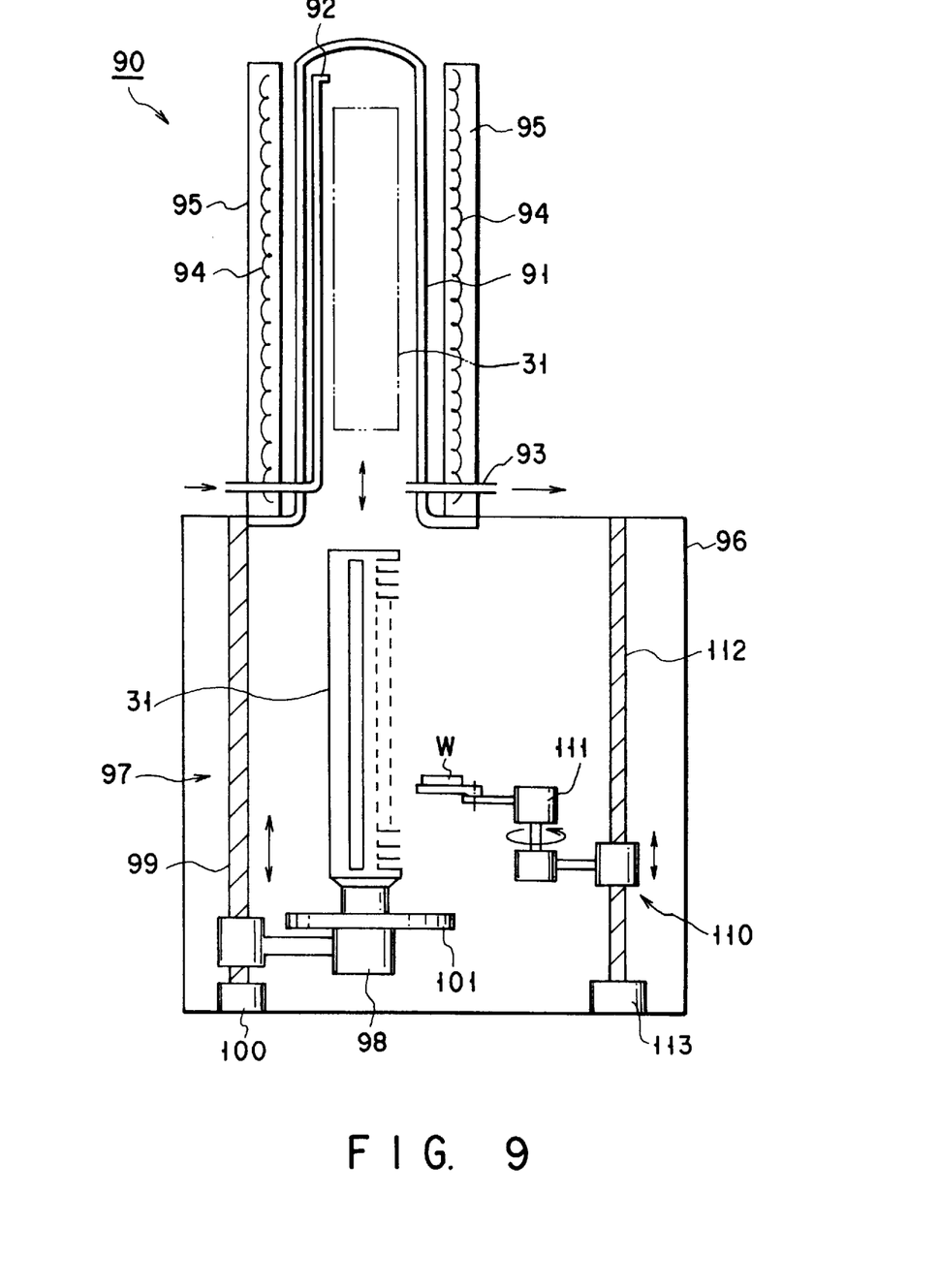
FIG. 9 is a diagrammatic view showing a vertical type heat processing apparatus.

With reference to FIG. 9, explanation will be given below about a vertical type heat processing apparatus equipped with the above-mentioned boat 31. The heat processing apparatus 90 is equipped with a cylindrical process tube 91 made of a heat-resistant member, such as quartz. The process tube 91 is closed at its top end and opened at its bottom end. A gas introducing nozzle 92 is arranged in a top zone in the process tube 91 and an exhaust nozzle 93 is arranged in a bottom zone to allow a gas present in the process tube 91 to be exhausted to an outside.

A heater 94 is arranged on the outside of the process tube 91 so as to surround the process tube 91. The inside of the process tube 91 is heated by the heater 94. An outside of the heater 94 is covered with a heat insulating material 95 so that heat is suppressed from emitting to an outside through the heater 94.

Although, in the present embodiment, the process tube 91 is comprised of a single-walled process tube, it may be comprised of a double-walled tube having an inner and an outer tube.

A boat-load/unload/wafer-transfer section 96 is provided below the process tube 91. In the boat-load/unload/wafer-transfer section 96, a boat elevator 97 is mounted to allow a boat 31 to be loaded into the process tube 91 via a lower end opening and the boat to be unloaded from the process tube 91. The boat elevator 97 comprises a support base 98 supporting a wafer boat 31, a ball screw 99 threaded into the support base 98 and mounted upright in the section 96 and a motor 100 turning the ball screw 99. A cover 101 is mounted on the support base 98. The ball screw 99 is turned by a motor 100 to allow the support base 98 to be moved up and down. The boat 31 carrying the wafers W therein is loaded/unloaded into/out of the process tube 91 through an up/down motion of the support base 98.

A wafer transfer means 110 is provided on the boat-load/unload/wafer-transfer section 96 to transfer a wafer W from a wafer carrier, not shown, to the boat 31. The wafer transfer means 110 has a multi-jointed arm 111 capable of being extended and contracted, a ball screw 112 threadably mounted in the arm 111 and extending upright and a motor 113 adapted to turn the ball screw 112. The arm 111 is moved up and down by turning the ball screw 112 by virtue of the motor 113. The arm 111 is moved up and down relative to the boat 31. Through these operations each unprocessed wafer W is placed on a corresponding support portion 36 and each processed wafer W is transferred away from the support portion 36.

Explanation will be given below about heat-processing the wafer W with the use of the heat processing apparatus of FIG. 9. First, unprocessed wafers W in a wafer cassette, not shown, are transferred by the wafer transfer means 110 to the boat 31 and, by doing so, 150 wafers at max., including dummy wafers, are held in place in the boat 31. Then the boat 31 is lifted by the boat elevator 98 with the wafers W held therein and into the process tube 91. When the boat 31 is introduced into the process tube 91, the lower end opening is hermetically closed by the cover 101. The process tube 91 is pre-heated to, for example, about 600° C. After the boat 31 has been so introduced, the process tube 91 is heated up, for example, at a 5° C./min. rate to a process temperature of about 800° C. for instance. At the same time, the interior of the process tube 91 is reduced down to a predetermined vacuum level. When the interior of the process tube 91 reaches a predetermined temperature and vacuum pressure, the wafers W are subjected to a predetermined heat process, such as a CVD process, while introducing a process gas into the process tube 91 via the gas introducing nozzle 92.

If the wafers W are heat processed as set out above, there is a possibility that they are weakened in their material through the heating up process or that a crystal defect, that is, a slip, is produced under their own weight. In the heat processing apparatus 90 equipped with the boat 31, the support portion 36, including the rest surface 56, is so formed as to have a substantially circular-arc configuration. Further, the rest surface 56 of every support portion has its flatness set to be not more than 0.1 mm and, hence, the edge portion of the wafer W can be microscopically set in positive face contact with the rest surface 56 of the support portion 36 because it is held in the flattened rest surface 56 of the support portion 36. By doing so, a load on the wafer W is distributed in dispersive way and prevented from being concentrated on a single spot. As a result, if the wafer W is heat processed, heat stress on the wafer W is relaxed, thus enabling a slip to be suppressed from being produced.

Although the above-mentioned heat processing apparatus 90 has been explained as being applied to the film forming apparatus, the boat 31 of the present embodiment can be used for a heat diffusion, an etching, an ashing or a thermal oxidation apparatus.

A test boat carrying 150 wafers of 8 inches was prepared and had the same configuration as that of the boat shown in FIG. 1. This boat was obtained, by a cutting operation, from a cylindrical body of silicon carbide and subjected to a CVD process to form a silicon carbide film on its surface. It is to be noted, however, that the rest surfaces of support portions had their flatness varied as will be set out below. That is, the rest surfaces of 24-and 126-th support portions situated from the top of the boat had their flatness set to be above 0.3, while the rest surfaces of 75-and 133-th support portions set to be not more than 0.1.

In such test boat, 8-inch wafers were placed with their major surfaces down on the rest surfaces of the support portions. Then, the boat was introduced into a longitudinal type heat processing furnace to subject the wafers in the boat to heat process at a heat-up/cool-down temperature rate R/R (° C./min.) at a R1 and R2 in Table 1. Thereafter, measurement was made for a slip line max. length on the major surfaces of the wafers situated on the 24-, 75-, 126- and 133-th wafer positions in the boat, the result of which is as shown in Table 2.

TABLE 1

| | test temperature | | |
|---|---|---|---|
| | temperature | heat-up/cool-down rate R/R (°C./min.) | |
| | (°C.) | R1 | R2 |
| heat-up | 800–950 | 8.0 | 8.0 |
| | 950–1000 | 5.0 | 8.0 |
| | 1000–1100 | 1.0 | 5.0 |
| | 1100–1150 | 0.5 | 2.0 |
| cool-down | 1150–1100 | −0.5 | −2.0 |
| | 1100–1000 | −1.0 | −2.5 |
| | 1000–800 | −2.5 | −2.5 |
| total time (min.) | | 509 | 215 |

TABLE 2

| | result of test temperature | | | |
|---|---|---|---|---|
| example | heat-up/ cool-down rate | wafer position | flatness (mm) on a rest surface | slip line max. length (m) |
| RUN1 | R1 | 24 | 0.3< | 40< |
| | | 75 | 0.1≧ | ND |
| | | 126 | 0.3< | 30 |
| | | 133 | 0.1≧ | 10 |
| RUN2 | R2 | 24 | 0.3< | 40< |
| | | 75 | 0.1≧ | 3 |
| | | 126 | 0.3< | 30 |
| | | 133 | 0.1≧ | 10 |

ND; non-detectable

As evident from Table 2, on the wafers placed on the support portions (24- and 126-th positions) having a flatness of above 0.3 on their rest surfaces, a slip line max. length exceeds 30 mm at RUN 1 and RUN 2 in either case. On the other hand, on the wafers placed on the support portions (75-th positions) having a flatness of less than 0.1 on their rest surfaces, no slips were detectable at RUN 1. Further, on the wafer placed on the support portion in the 133-th wafer position, the slip line max. length was 10 mm. At Run 1, on the wafers placed on the 75-and 133-th support portions, their slip line max. lengths were, respectively, 3 mm and 10 mm. It has been confirmed, as set out above, that the slip line max. length is largely reduced at the flatness of less than 0.1 as compared with that at the flatness of above 0.3.

In this test, the wafers were placed with their major surfaces down on their rest surfaces. The test was conducted under more severe conditions than under an actual heat process with which the wafer will suffers. The test thus conducted has proved that the boat of the present embodiment having a set flatness of less than 0.1 on the support portions' rest surface can prevent slips from occurring on the major surfaces of the wafers even under more severe conditions which the wafers normally suffer.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A boat for supporting a plurality of objects to be processed, comprising:

a bottom section;

a prop section mounted upright on the bottom section;

a top plate mounted on an upper end of the prop section; and a plurality of support portions supported on the prop section and each having a rest surface where an object to be processed is placed; wherein the rest surface of each support portion is so set that a flatness thereof is not more than 0.1 mm.

2. The boat according to claim 1, wherein the rest surface of the support portion is substantially circular arc-like in configuration.

3. The boat according to claim 1, wherein the support portion is substantially annular with at least a portion thereof cut off.

4. The boat according to claim 1, wherein the support section is substantially annular in configuration and has an opening to which transfer means can be entered in the support section to allow the object to be loaded and placed on the rest surface of the support section.

5. The boat according to claim 4, wherein another opening is provided in the support section to allow the transfer means to extend therethrough.

6. The boat according to claim 1, wherein the prop section is substantially cylindrical and has an opening to which transfer means can be entered into the prop section to allow the object to be loaded and placed on the rest surface of the support portion.

7. The boat according to claim 6, wherein another opening is provided in a portion of the prop section to allow the transfer means to extend therethrough.

8. The boat according to claim 6 or 7, wherein a slit is provided in a portion or portions of the prop section in a way to expend along a longitudinal direction of the prop section.

9. The boat according to claim 6, wherein the support portions are provided in a inside of the cylindrical prop section.

10. The boat according to claim 1, being made of quartz or silicon carbide.

\* \* \* \* \*